United States Patent [19]

Pammer et al.

[11] Patent Number: 4,600,600
[45] Date of Patent: Jul. 15, 1986

[54] METHOD FOR THE GALVANIC MANUFACTURE OF METALLIC BUMP-LIKE LEAD CONTACTS

[75] Inventors: Erich Pammer, Taufkirchen; Otfried Bischofberger, Munich, both of Fed. Rep. of Germany

[73] Assignee: Siemens Aktiengesellschaft, Berlin & Munich, Fed. Rep. of Germany

[21] Appl. No.: 666,194

[22] Filed: Oct. 29, 1984

[30] Foreign Application Priority Data

Nov. 30, 1983 [DE] Fed. Rep. of Germany ....... 3343362

[51] Int. Cl.$^4$ .................... H01L 21/60; H01L 21/445
[52] U.S. Cl. ........................................ 427/89; 357/67; 427/96
[58] Field of Search ............... 427/89, 96, 88; 357/67, 357/69, 71

[56] References Cited

U.S. PATENT DOCUMENTS 3,881,884  5/1975  Cook et al. ........................... 427/89
4,005,472  1/1977  Harris et al. ......................... 357/71
4,434,434  2/1984  Bhattacharya et al. .............. 357/71

FOREIGN PATENT DOCUMENTS 2613759  10/1977  Fed. Rep. of Germany .

OTHER PUBLICATIONS

Ordonez *IBM Tech. Disc. Bull.* vol. 15, No. 4, Sep. 1972. p. 1088.
Japanese Application No. 55-8613 (Kenichi Ogawa) "Gold Bump Forming Method of Semiconductor Device" vol. 5, No. 179 (E-82) (851) Nov. 17, 1981.

*Primary Examiner*—John H. Newsome
*Attorney, Agent, or Firm*—Hill, Van Santen, Steadman & Simpson

[57] ABSTRACT

A method of galvanic manufacture of bump-like lead contacts of semiconductor components. The lead contacts are formed of etchable metals having a surface coating of gold. The gold is chemically deposited onto the lead contacts in a first and in a second work step. In the first work step, the deposition occurs to a thickness of 10 to 200 nm, and in the second work step to a thickness of 50 to 200 nm. Etching processes and a tempering occur between the two work steps. The surface layer applied in the first work step is employed during the etching processes as an etching mask for the lead contacts. This surface layer then diffuses into the lead contacts during the tempering. The solderablity of the lead contacts is thus preserved over a longer than usual time span (factor of 20).

7 Claims, 6 Drawing Figures

METHOD FOR THE GALVANIC MANUFACTURE OF METALLIC BUMP-LIKE LEAD CONTACTS

BACKGROUND OF THE INVENTION

The invention relates to a method for the galvanic manufacture of metallic, bump-like lead contacts of semiconductor components wherein the lead contacts are formed of etchable metals having a surface coating of gold.

In the modern semiconductor industry, specifically in the fabrication of integrated semiconductor components, automatic tape assembly ("Tape Automatic Bonding", TAB) is being employed to an increasing degree. One of the basic prerequisites in semiconductor manufacture according to this TAB technology is that the semiconductor component (chip) does not, as was hitherto usual, have metallized contact surfaces at the locations (pads) provided for contacting which, for example, consist of aluminum. Rather, the chip has bump-like, metallic lead contacts (consisting, for example, of copper) which project above the chip surface.

As known, cuprous lead contacts oxidize at the surface given long storage, this reducing the solderability which is normally good for copper. In order to prevent this, such lead contacts are generally coated with a sufficiently thick gold layer. Even at room temperature, however, this gold layer diffuses into the surface of the lead contact to a certain degree, and this has to be taken into consideration in the identification of the required thickness of the gold coating.

A thin, metallic layer sequence which acts as an adhesion layer and diffusion barrier is situated between the lead contacts and the corresponding chip-internal interconnects. This, for example, consists of titanium and copper or of titanium-tungsten and copper. Known manufacturing methods for the thin, metallic layer sequence and for the lead contacts consist of vapor-depositing or sputtering the individual materials employed onto the semiconductor element in surface-wide fashion and masking by standard photolithographic methods, such as with photoresist at those locations at which the lead contacts are to be produced. The previously vapor-deposited materials are in turn etched off by means of a wet-chemical method in the remaining, unmasked regions of the chip. Given a surface-wide sputtering of the semiconductor circuit with the material for creating the lead contacts, for example copper to a thickness of 20 $\mu$m, too high a sputtering heat and different coefficients of thermal expansion of the basic semiconductor material (generally silicon) and of the lead contact material (copper) also are present. All of this leads to a risk that considerable sags of the semiconductor wafers to be processed, stresses, crystal fractures, and cracks will arise within the semiconductor component, and that damage (cracks) in the so-called final passivation layer applied to the surface of the semiconductor in order to protect against the mechanical damage will occur. For example, the following sags in approximately 400 $\mu$m thick silicon wafers given a copper application of respectively 20 $\mu$m have been measured:

in 3-inch wafers—180 $\mu$m$\pm$20 $\mu$m,
in 4-inch wafers—300 $\mu$m$\pm$40 $\mu$m.

In addition to the mechanical damage described above, mis-adjustments in the following phototechnique masking also occur due to the sagging.

When, instead of executing the steps of surface-wide sputtering, phototechnique steps, and etching of excess copper material, lead contacts of copper are electro-deposited, then the damage described above does not occur. A new problem, however, arises as described hereafter.

After the electro-deposition of the lead contacts, the thin, metallic layer sequence that has at first been applied surface-wide must again be etched off in the regions outside of the lead contacts. In this etching process, however, the lead contacts are also attacked, whereby considerable causticization appears at the contacts, this leading to considerable failures in a solder bonding executed later as a consequence of the differing etching erosion.

SUMMARY OF THE INVENTION

An object of the present invention is to create as simple a method as possible which enables the galvanic manufacture of bump-like lead contacts of etchable metals without cocausticization of the lead contacts when etching the thin, metallic layer sequence.

Given a method of the type initially cited, this object is achieved by applying a first coating of gold on the bump-like lead contact in a first gold application work step. This first gold surface coating is employed as an etching protection corresponding to an etching mask for an etching of the thin, metallic layer sequence between the lead contact and semiconductor circuit body. Thereafter, the circuit with the lead contacts is tempered so that the first gold layer diffuses in to the lead contacts. Thereafter, in a second gold layer application work step, a thin gold layer is deposited which is prevented from diffusing into the lead contact in view of a concentration of the gold diffused from the first work step near the surface of the lead contact.

The invention is advantageously applicable to all known semiconductor circuits, regardless of the circuit technology employed, and is employable, for example, with bipolar and MOS circuits.

DESCRIPTION OF THE PREFERRED EMBODIMENTS

Figure 1:
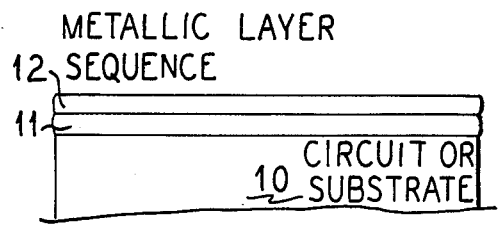
FIGS. 1 through 6 illustrate method steps according to the invention wherein first and second gold layers are applied to bump-like lead contacts of a semiconductor circuit.

As shown in FIG. 1, and as previously described, a semiconductor circuit or substrate 10 has deposited on it a thin, metallic layer sequence 11, 12 as an adhesion layer and diffusion barrier and which will be situated between the bump-like lead contacts and the chip-internal interconnects. Such a layer sequence can comprise titanium and copper or titanium-tungsten and copper. This whole sequence is deposited by vapor deposition or sputtering onto the semiconductor element 10 in surface-wide fashion.

Figure 2:
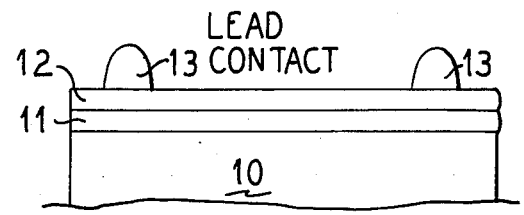

Thereafter, as shown in FIG. 2 the bump-like lead contacts 13 formed of copper are electro-deposited onto the layer sequence 11, 12.

Figure 3:
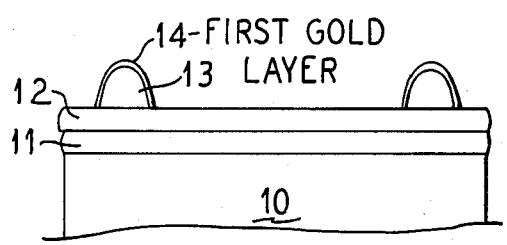
Figure 4:
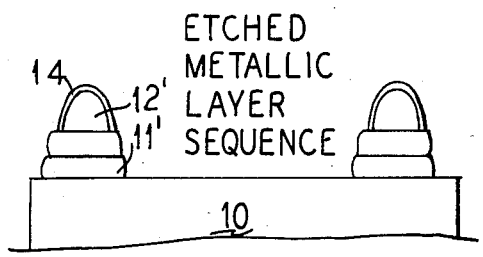
Figure 5:
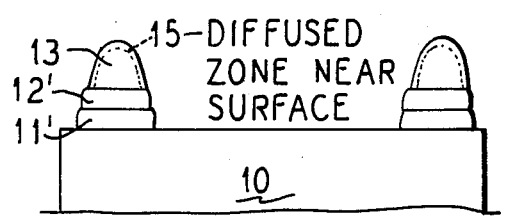

Thereafter, in a first gold application work step, as shown in FIG. 3, a surface coating of gold 14 in a thickness of 10 through 200 nm is chemically deposited in current-free manner on the bump-like lead contacts 13 of the semiconductor circuit 10. The lead contacts 13 were galvanically produced in accordance with the above described known methods. This deposition can ensue in accordance with the standard prior art, for example, by use of potassium-gold-cyanide complexes having a pH value of 5 through 9. Subsequently as shown in FIG. 4, the thin metallic layer sequence 11, 12 in the region outside of the lead contacts are in turn etched off in a fashion that is likewise known so as to leave remaining etched layers 11' and 12', whereby the surface coating 14 of gold previously applied to the lead contacts 13 advantageously protects these against attack by the etching agent employed. The surface coating 14 of gold thus has the advantageous protective effect of an etching mask. In order to re-obtain good electrical behavior of the circuits within the semiconductor components (for example, linearity of current amplification curves) which has been considerably deteriorated, particularly due to the vapor-deposition or sputtering of the thin, metallic layer sequence 11, 12, it is necessary according to the invention as shown in FIG. 5 to subsequently execute a tempering of the semiconductor circuit 10 for 5 to 30 minutes at 200° to 450° C. in a nitrogen forming gas or hydrogen atmosphere. The surface coating 14 of gold applied to the lead contacts in the first work step, however, thus completely diffuses into the lead contacts as shown with dotted lines at 15 in FIG. 5.

Figure 6:
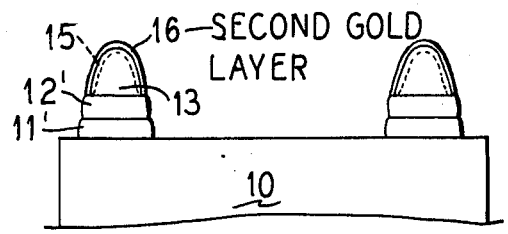

Since as a result of this diffusion the lead contacts 13 are no longer protected against oxidation and corrosion due to atmospheric influences, etc., a further surface coating 16 of gold as shown in FIG. 6 is now applied to the lead contacts 13 in a second gold application work step. This can occur in the same fashion as in the first gold application work step. Advantageously, the thickness of this surface coating 16 only amounts to 50 to 200 nm in order to guarantee gold solderability of the lead contacts even over longer storage times. Given the slight thickness of the surface coating 16 of the second work step according to the invention, this effect is achieved by means of the advantageous afore-mentioned tempering wherein a concentration of the gold from the surface coating applied in the first work step is still near the surface of the lead contacts as shown at 15 in FIG. 5 and FIG. 6. The gold of the surface coating 16 of the second work step is thus prevented from diffusing into the lead contacts 13.

Tests have shown that preservation of good solderability of lead contacts manufactured according to the invention could be extended by a factor of 20 in comparison to lead contacts into which no gold was diffused before an application of a surface coating of gold.

Although various minor changes and modifications might be proposed by those skilled in the art, it will be understood that we wish to include within the claims of the patent warranted hereon all such changes and modifications as reasonably come within our contribution to the art.

We claim as our invention:

1. In a method for galvanic manufacture of bump-like lead contacts on a semiconductor circuit, and wherein the lead contacts are formed of an etchable metal having a surface coating of gold, and wherein under the bump-like lead contacts a thin, metallic layer sequence is provided as an adhesion layer and diffusion barrier between the lead contacts and a surface of the semiconductor circuit, wherein the improvement comprises:
   after forming the metallic layer sequence on the surface of the semiconductor circuit, electrodepositing the bump-like lead contacts on the thin, metallic layer sequence, and thereafter applying a first coating of gold on the bump-like lead contacts;
   employing the first gold coating as an etching protection for a subsequent etching to remove portions of the thin, metallic layer sequence not lying beneath the bump-like lead contacts;
   tempering the circuit and lead contacts so that the first gold layer diffuses into the bump-like lead contacts in a region of a surface of the lead contacts; and
   providing a second gold layer on the lead contacts, said second gold layer being substantially prevented from diffusing into the lead contacts by the diffused-in first gold layer near the surface of the lead contacts.

2. A method according to claim 1 wherein the application of said first gold layer occurs in current-free manner by means of a chemical deposition onto said lead contacts and having a thickness of 10 to 200 nm.

3. A method according to claim 1 wherein said tempering occurs in a nitrogen forming gas atmosphere, whereby said first gold coating completely diffuses into said lead contacts.

4. A method according to claim 1 wherein said tempering ensues at 200° to 450° C. for a duration of 5 to 30 minutes.

5. A method according to claim 1 wherein the application of said second gold coating ensues current-free by means of chemical deposition onto said lead contacts and having a thickness of 50 to 200 nm.

6. A method for galvanic manufacture of bump-like lead contacts on a semiconductor component, comprising the steps of:
   depositing a thin, metallic layer sequence as an adhesion layer and diffusion barrier on a surface of the semiconductor component;
   electro-depositing bump-like lead contacts on the metallic layer sequence;
   depositing a first coating of gold on the bump-like lead contacts;
   etching the metallic layer sequence at regions beyond the bump-like lead contacts while using the first gold coating as an etching protection;
   diffusing the first gold layer into the bump-like lead contacts; and
   providing a second gold layer on the lead contacts, said second gold layer preventing substantial in-diffusion of the second gold layer into the lead contacts.

7. A method for the manufacture of terminal contacts of semiconductor components, comprising the steps of:
   providing on a semiconductor component a layer;
   voltaically applying an etchable metal on the layer as a terminal contact;
   applying a surface coating of gold on the etchable metal terminal contact;
   etching the thin metallic layer system by using the surface coating of gold for protecting the terminal contact during such etching;
   after the etching, tempering the semiconductor component with the etched layer sequence and terminal contact, the coating of gold diffusing into the terminal contact during the tempering; and
   applying another relatively thin coating of gold at a surface of the terminal contact so as to protect it against oxidation and corrosion which would otherwise occur due to the diffusing in of the first coating of gold.

* * * * *